United States Patent [19]

Watanabe et al.

[11] Patent Number: 4,941,430

[45] Date of Patent: Jul. 17, 1990

[54] APPARATUS FOR FORMING REACTIVE DEPOSITION FILM

[75] Inventors: Kazuhiro Watanabe; Kazuya Saito; Yoshiyuki Yuchi; Konosuke Inagawa, all of Ibaragi, Japan

[73] Assignee: Nihon Sinku Gijutsu Kabusiki Kaisha, Chigasaki, Japan

[21] Appl. No.: 185,863

[22] Filed: Apr. 25, 1988

[30] Foreign Application Priority Data

May 1, 1987 [JP] Japan .................. 62-106427

[51] Int. Cl.$^5$ .............................. C23C 16/50
[52] U.S. Cl. ..................... 118/723; 204/298.06; 204/298.13; 204/298.16; 427/35; 427/47
[58] Field of Search ............ 118/50.1, 723, 724; 427/35, 47, 38; 204/192.31, 298; 250/492.3

[56] References Cited

U.S. PATENT DOCUMENTS

| | | | |
|---|---|---|---|
| 3,120,609 | 2/1964 | Farrell | 250/492.3 |
| 3,437,734 | 4/1969 | Roman et al. | 204/192.31 |
| 3,903,421 | 9/1975 | Benedetti | 250/492.3 |
| 4,281,251 | 7/1981 | Thompson et al. | 250/492.3 |
| 4,415,420 | 11/1983 | Beale | 204/192.31 |
| 4,487,162 | 12/1984 | Cann | 118/723 |
| 4,492,873 | 1/1985 | Dmitriev et al. | 250/492.3 |
| 4,740,263 | 4/1988 | Imai et al. | 427/42 |
| 4,777,908 | 10/1988 | Temple et al. | 118/723 |

FOREIGN PATENT DOCUMENTS

| | | | |
|---|---|---|---|
| 54-6877 | 1/1979 | Japan | 204/192.31 |
| 59-205470 | 11/1984 | Japan | 118/723 |
| 59-226176 | 12/1984 | Japan | 118/723 |
| 60-262964 | 12/1985 | Japan | 118/723 |
| 61-183463 | 8/1986 | Japan | 118/723 |
| 61-183813 | 8/1986 | Japan | 204/192.31 |
| 61-204370 | 9/1986 | Japan . | |
| 61-284579 | 12/1986 | Japan | 118/723 |
| 62-47472 | 3/1987 | Japan . | |
| 62-77454 | 4/1987 | Japan . | |

OTHER PUBLICATIONS

Saito, Takeshi et al., "Silicon Epitaxial Solar Cells by Ion-Plating Deposition", Japanese J. of Applied Physics, vol. 19 (1980) Supp. 19-2, pp. 49-53.

Primary Examiner—Richard Bueker
Assistant Examiner—Terry J. Owens
Attorney, Agent, or Firm—Jones, Day, Reavis & Pogue

[57] ABSTRACT

An apparatus for forming a reactive deposition film includes a member for supporting a body to be coated in a vacuum chamber; an evaporation source of element constituting the reactive deposition film; apparatus for introducing a reaction gas into the vacuum chamber; bias apparatus for applying a high frequency or radio frequency (rf) bias voltage to the body; an electron beam generator for supplying electron beams towards the body; and a magnetic field generator which generates such a magnetic field that distributes the electron beams supplied from the electron beam generator uniformly to the whole region adjacent to the surface of the body and traps electrons from the electron beams in the region, whereby plasma of high density can be formed uniformly in the whole region adjacent to the surface of the body. In another apparatus, further a second bias apparatus for applying a DC (direct current) bias voltage or AC (alternate current) bias voltage to the gas introducing apparatus for activating the reaction is provided.

16 Claims, 2 Drawing Sheets

APPARATUS FOR FORMING REACTIVE DEPOSITION FILM

BACKGROUND OF THE INVENTION

1. Field of the Invention

This invention relates to an apparatus for forming a reactive deposition film such as a cubic boron nitride film on a part, a tool or the like which requires wear resistance and corrosion resistance.

2. Description of the Prior Art

Methods disclosed in the Japanese Patent Opening Gazette Nos. 204370/1986, 47472/1987 and 77454/1987 are given as examples for the forming techniques of the cubic boron nitride film by the reactive vapor deposition.

In the method disclosed in the Japanese Patent Opening Gazette No. 204370/1986, plasma abundant in electrons is produced by hollow cathode discharge, and a part of the electrons are attracted towards a reaction gas inlet. Gas is activated, and so reactivity for reactive vapor deposition has been improved.

In the method disclosed in the Japanese Patent Opening Gazette No. 47472/1987, a DC or AC bias voltage is applied to a reaction gas introducing nozzle which is called "activation nozzle", so that plasma is produced with high density. Ions are injected to a body to be coated, from the plasma of high density. Radio frequency (rf) or high frequency bias voltage is applied to the body to be coated. Thus, a cubic boron nitride film is formed on the body.

In the Japanese Patent Opening Gazette No. 77454/1987, such a method for forming a cubic boron nitride film is disclosed that a DC or AC bias voltage is applied to the activation nozzle to produce a plasma of high density, a rf bias voltage is applied to a body to be coated, and a reaction gas such as nitrogen gas or hydronitrogen gas and a discharge base gas such as argon are mixed and introduced into the vacuum chamber through the activation nozzle, or concurrently introduced thereinto.

In both of the above described second method (Japanese Patent Opening Gazette No. 47472/1987) and third method (Japanese Patent Opening Gazette No. 77454/1987), the bias voltage is applied to the gas introducing nozzle so that plasma of high density is produced adjacent to the opened portion of the gas introducing nozzle, while the rf bias voltage is applied to the body to be coated, and ions are injected into the body from the plasma of high density so as to form a cubic boron nitride film on the body.

The cubic boron nitride film can be formed on the body such as the part or the tool by the above-described methods in which the activation nozzle is provided, and the rf bias voltage is applied to the body to be coated. However, the plasma density is low in a region adjacent to some portion of the body being farther from the activation nozzle. Accordingly, the area on which the cubic boron nitride film can be formed, cannot be increased in the body to be coated. When the above described methods are used for an actual manufacturing apparatus, the number of the activation nozzles should be increased for forming the cubic boron nitride film on a sufficiently wide area of the body. The cost and size of the actual manufacturing apparatus become accordingly high and large.

SUMMARY OF THE INVENTION

Accordingly, it is an object of this invention to provide an apparatus for forming a reactive deposition film in which plasma of high density can be uniformly concentrated near a body to be coated, and so the reactive deposition film can be formed on a wide area of the body.

Another object of this invention is to provide an apparatus for forming a reaction deposition film which can be sufficiently suitable for an actual manufacturing apparatus in view of cost and size.

In accordance with an aspect of this invention, an apparatus for forming a reactive deposition film comprising: (A) means for supporting a body to be coated in a vacuum chamber; (B) an evaporation source of element or elements constituting said reactive deposition film; (C) means for introducing a reaction gas into said vacuum chamber; (D) bias means for applying a high frequency or radio frequency (rf) bias voltage to said body; (E) an electron beam generator for supplying electron beams towards said body; and (F) a magnetic field generator which generates such a magnetic field that distributes said electron beams supplied from said electron beam generator uniformly to the whole region adjacent to the surface of said body and traps electrons from said electron beams in said region, whereby plasma of high density can be formed uniformly in the whole region adjacent to the surface of said body.

In accordance with another aspect of this invention, an apparatus for forming a reactive deposition film comprising; (A) means for supporting a body to be coated in a vacuum chamber; (B) an evaporation source of element or elements constituting said reactive deposition film; (C) means for introducing a reaction gas into said vacuum chamber; (D) a first bias means for applying a high frequency or radio frequency (rf) bias voltage to said body; (E) a second bias means for applying a DC (direct current) bias voltage or AC (alternate current) bias voltage to said gas introducing means for activating said reation gas; (F) an electron beam generator for supplying electron beams towards said body; and (G) a magnetic field generator which generates such a magnetic field that distributes said electron beams supplied from said electron beam generator uniformly to the whole region adjacent to the surface of said body and traps electrons from said electron beams in said region, whereby plasma of high density can be formed uniformly in the whole region adjacent to the surface of said body.

The foregoing and other objects, features, and advantages of the present invention will be more readily understood upon consideration of the following detailed description of the preferred embodiments of the invention, taken in conjunction with the accompanying drawings.

DESCRIPTION OF THE PREFERRED EMBODIMENTS

Figure 1:
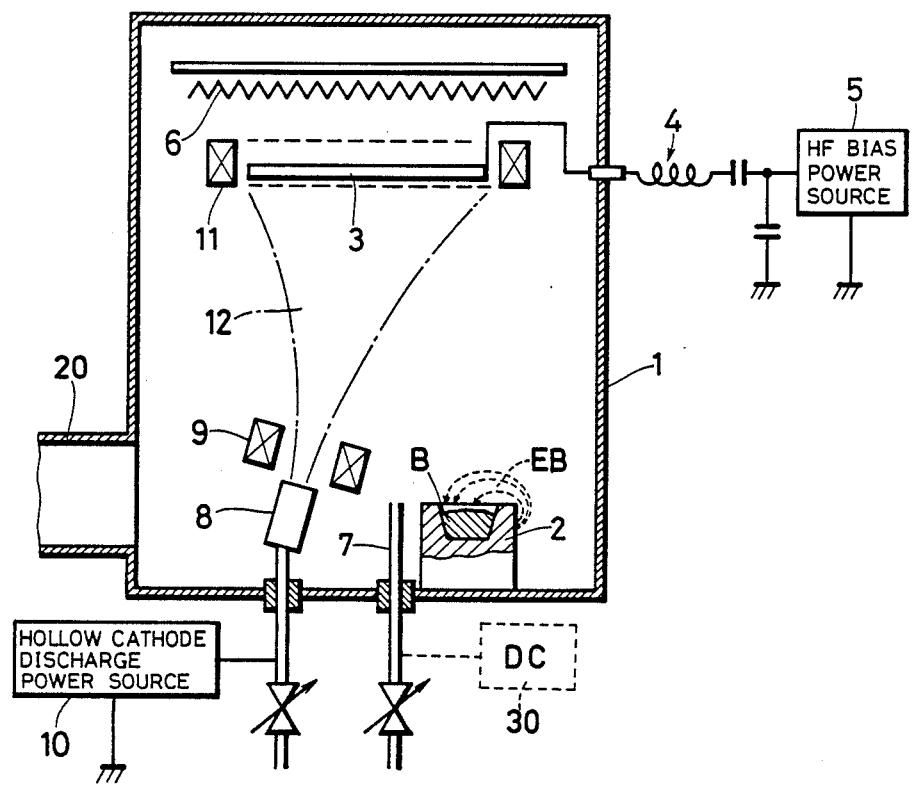
FIG. 1 is a schematic cross-sectional view of an apparatus for forming a cubic boron nitride film as a reactive deposition film, according to a first embodiment of this invention.

Referring to FIG. 1, an evaporation source 2 of the hollow cathode discharge type for generating vapor of boron is arranged in a vacuum tank or chamber 1. Only a hearth is shown in FIG. 1 for the evaporation source 2, and it contains boron B. Electron beams EB as shown by the dash-lines, heat and evaporate boron in the hearth of the evaporation source 2.

The EB generator may be arranged as a separate body above the hearth.

A substrate 3 on which a cubic boron nitride film is to be formed, is arranged above the evaporation source 2, and it is supported by a not-shown supporting means. A high frequency or rf power source 5 is connected through a matching circuit 4 of the capacitive coupling type which consists of capacitors and an inductance coil, to the substrate 3 for applying a high frequency or rf bias voltage thereto. Further a heater 6 is arranged at the back side of the substrate 3 for heating the latter. A reaction gas introduction nozzle 7 for introducing a reaction gas such as $N_2$ and $NH_3$ into the vacuum tank 1 is arranged at the side of the evaporation source 2 of the hollow cathode discharge type. Further, an electron gun 8 of the hollow cathode discharge type for supplying electron beams towards the substrate 3 is arranged at the side of the reaction gas introduction nozzle 7, and it is provided with a magnet 9 for forming electron beams, at its top end. Electrons are trapped by magnetic fluxes from the magnet 9, and so the electron beams are effectively thrown to the substrate 3. A power source 10 for hollow cathode discharge is connected to the electron gun 8 of the hollow cathode discharge type.

A magnet 11 for trapping electrons is so arranged near the substrate 3 that the electron beams from the electron gun 8 are uniformly distributed in accordance with the size of the substrate 3 on which a cubic boron nitride film is to be formed, and the electrons are prevented from unnecessary diffusion outwards, by the magnetic flux trapping action. Further, an exhausting opening 20 is made at the side wall of the vacuum tank 1, and it is connected to a not-shown exhausting system.

Next, there will be described operations of the apparatus of FIG. 1.

Boron evaporates from the evaporation source 2 of the hollow cathode discharge type. $N_2$ gas is introduced into the vacuum tank 1 from the reaction gas introduction nozzle 7. The electron gun 8 of the hollow cathode discharge type is operated. Current is made to flow through the magnet 9 for forming electron beams. Thus, the magnet 9 is energized to generate magnetic flux. The electron beams from the electron gun 8 are directed by the magnetic flux, and are thrown towards the substrate 3. An energizing current to the magnet 11 arranged near the substrate 3 is so adjusted that the electron beams from the electron gun 8 are uniformly distributed in accordance with the size of the substrate 3 due to magnetic flux trapping action. Thus, a plasma region of high density as shown by a reference numeral 12 is formed in accordance with the size of the substrate 3. Under such a condition, the high frequency bias voltage is applied to the substrate 3 through the matching circuit 4 of the capacitive coupling type from the high frequency power source 5. Thus, a cubic boron nitride film is well formed on the substrate 3. The effective coating area can be increased in comparison with the prior art. Further, the film can be formed at a higher rate.

Figure 2:
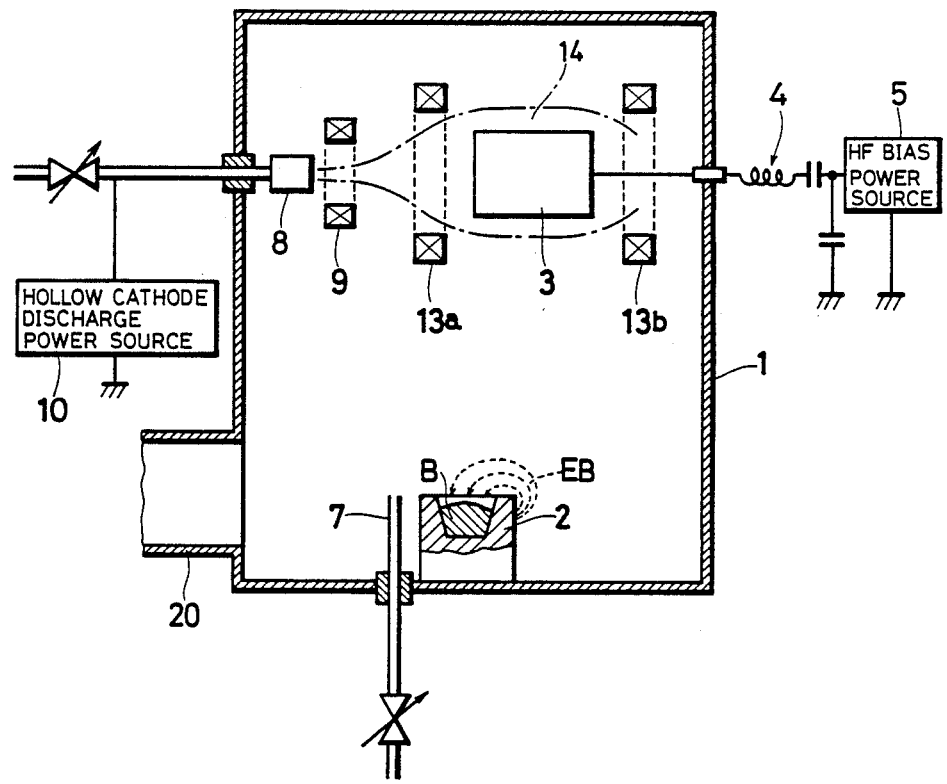
FIG. 2 is a schematic cross-sectional view of an apparatus for forming a cubic boron nitride film as a reactive deposition film, according to a second embodiment of this invention.

FIG. 2 shows an apparatus for forming a cubic boron nitride film, according to a second embodiment of this invention. Parts in FIG. 2 which correspond to those in FIG. 1, are denoted by the same reference numerals, the description of which will be omitted.

In this embodiment, the electron gun 8 is fixed at the side wall of the vacuum tank 1, and the electron beams for forming plasma are introduced laterally with respect to the substrate 3. Thus, the electron gun 8 of the hollow cathode discharge type is so arranged as to be substantially parallel with the surface of the substrate 3 which is vertically arranged as shown in FIG. 2. Magnets 13a and 13b are arranged at the left and right sides of the substrate 3, respectively. The electron beams from the electron gun 8 are directed by the magnetic flux of the magnet 9, and they are thrown towards the substrate 3. They are uniformly distributed by the magnetic trapping action of the magnets 13a and 13b, with respect to the substrate 3. Thus, a plasma region of high density as shown by a reference numeral 14, is so formed as to cover the substrate 3. The other operations and effects of the apparatus of FIG. 2 are the same as those of the apparatus of FIG. 1. The apparatus of FIG. 1 and FIG. 2 both are well suitable for an actual manufacturing apparatus, in view of cost and size.

While the preferred embodiments have been described, variations thereto will occur to those skilled in the art within the scope of the present inventive concepts which are delineated by the following claims.

For example, in the above embodiments, the evaporation source 2 is of the hollow cathode discharge type. Instead, it may be of other types, such as the high voltage electron beam type.

Further, in the above embodiments, the electron gun 8 is of the hollow cathode discharge type. Instead, it may be of other types such as a bucket-type plasma gun.

Further, in the above embodiments, the cubic boron nitride film is formed on the substrate 3. However, it should be understood that the apparatus shown in FIG. 1 or FIG. 2 can be used also for forming another reactive deposition film.

Further, a DC bias power source 30 as shown by the dash line in FIG. 1, may be connected to the reaction gas introduction nozzle 7 for applying a DC bias voltage. Or an AC bias voltage may be applied to the reaction gas introduction nozzle 7. Of course, a DC or AC bias voltage may be applied to the nozzle 7 shown in FIG. 2. The reaction gas is partially ionized and neutrally excited by the DC or AC bias applied to the nozzle 7. Thus, the nozzle 7 may be an activating nozzle. In that case, the film deposition rate can be improved.

What is claimed is:

1. An apparatus for forming a reactive deposition film comprising:
   (A) means for supporting a body to be coated in a vacuum chamber;
   (B) an evaporation source of element or elements constituting said reactive deposition film;
   (C) means for introducing a reaction gas into said vacuum chamber;
   (D) bias means for applying a high frequency or radio frequency (rf) bias voltage to said body;
   (E) an electron beam generator for supplying electron beams towards said body; and (F) a magnetic field generator which generates such a magnetic field that distributes said electron beams supplied from said electron beam generator uniformly to the whole region adjacent to the surface of said body and traps electrons from said electron beams in said region, whereby plasma of high density can be formed uniformly in the whole region adjacent to the surface of said body.

2. An apparatus for forming a reactive deposition film comprising:
 (A) means for supporting a body to be coated in a vacuum chamber;
 (B) an evaporation source of element or elements constituting said reactive deposition film;
 (C) means for introducing a reaction gas into said vacuum chamber;
 (D) a first bias means for applying a high frequency or radio frequency (rf) bias voltage to said body;
 (E) a second bias means for applying a DC (direct current) bias voltage or AC (alternate current) bias voltage to said gas introducing means for activating said reaction gas;
 (F) an electron beam generator for supplying electron beams towards said body; and
 (G) a magnetic field generator which generates such a magnetic field that distributes said electron beams supplied from said electron beam generator uniformly to the whole region adjacent to the surface of said body and traps electrons from said electron beams in said region, whereby plasma of high density can be formed uniformly in the whole region adjacent to the surface of said body.

3. An apparatus according to claim 1, in which said magnetic field generator is so arranged as to surround the peripheral edge of said body which is plate-like.

4. An apparatus according to claim 1, in which said magnetic field generator consists of two members being arranged at the opposite sides of said body which is plate-like.

5. An apparatus according to claim 3, in which said electron beam is supplied against the surface of said plate-like body.

6. An apparatus according to claim 4, in which said electron beam is supplied substantially in parallel with the surface of said plate-like body.

7. An apparatus according to claim 1, in which said evaporation source is a hearth containing a constituent of said reactive deposition film and, it is arranged in opposition to said body in said vacuum chamber.

8. An apparatus according to claim 7, in which a heater is arranged at the back side of said body with respect to said hearth.

9. An apparatus according to claim 8, in which said constituent is boron, and said reaction gas is $N_2$, so that said reactive deposition film is a cubic boron nitride film.

10. An apparatus according to claim 2, in which said magnetic field generator is so arranged as to surround the peripheral edge of said body which is plate-like.

11. An apparatus according to claim 2, in which said magnetic field generator consists of two members being arranged at the opposite sides of said body which is plate-like.

12. An apparatus according to claim 10, in which said electron beam is supplied against the surface of said plate-like body.

13. An apparatus according to claim 11, in which said electron beam is supplied substantially in parallel with the surface of said plate-like body.

14. An apparatus according to claim 2, in which said evaporation source is a hearth containing a constituent of said reactive deposition film and, it is arranged in opposition to said body in said vacuum chamber.

15. An apparatus according to claim 14, in which a heater is arranged at the back side of said body with respect to said hearth.

16. An apparatus according to claim 15, in which said constituent is boron, and said reaction gas is $N_2$, so that said reactive deposition film is a cubic boron nitride film.

* * * * *